US006475894B1

United States Patent
Huang et al.

(10) Patent No.: US 6,475,894 B1
(45) Date of Patent: Nov. 5, 2002

(54) PROCESS FOR FABRICATING A FLOATING GATE OF A FLASH MEMORY IN A SELF-ALIGNED MANNER

(75) Inventors: Chung-Lin Huang, Taichung (TW); Sheng-Tsung Chen, Tainan (TW); Chi-Hui Lin, Taipei (TW)

(73) Assignee: Nanya Technology Corporation, Taoyuan (TW)

( * ) Notice: Subject to any disclaimer, the term of this patent is extended or adjusted under 35 U.S.C. 154(b) by 0 days.

(21) Appl. No.: 10/052,622

(22) Filed: Jan. 18, 2002

(51) Int. Cl.[7] ........................................... H01L 21/8247
(52) U.S. Cl. ....................................... 438/593; 438/596
(58) Field of Search ................................. 438/257–267, 438/593–594, 596

(56) References Cited

U.S. PATENT DOCUMENTS

| | | | | |
|---|---|---|---|---|
| 5,646,059 A | * | 7/1997 | Sheu et al. ................... | 438/257 |
| 6,153,472 A | * | 11/2000 | Ding et al. ................... | 438/264 |
| 6,171,909 B1 | * | 1/2001 | Ding et al. ................... | 438/267 |
| 6,194,300 B1 | * | 2/2001 | Hung et al. ................... | 438/266 |
| 6,197,637 B1 | * | 3/2001 | Hsu et al. ..................... | 438/257 |
| 6,232,635 B1 | * | 5/2001 | Wang et al. ................... | 257/315 |
| 2001/0002714 A1 | * | 6/2001 | Doan ........................... | 257/316 |
| 2002/0025631 A1 | * | 2/2002 | Bez et al. ..................... | 438/257 |

* cited by examiner

Primary Examiner—Richard Booth
(74) Attorney, Agent, or Firm—Ladas & Parry

(57) ABSTRACT

The present invention provides a process for fabricating a floating gate of a flash memory. First, an isolation region is formed in a semiconductor substrate and the isolation region has a height higher than the substrate. A gate oxide layer and a first polysilicon layer are then formed. The first polysilicon layer is formed according to the contour of the isolation region to form a recess in the first polysilicon layer. A sacrificial insulator is filled into the recess. The first polysilicon layer is then selectively removed in a self-aligned manner using the sacrificial insulator as a hard mask to expose the isolation region. A polysilicon spacer is formed on the sidewalls of the first polysilicon layer. A first mask layer is formed on the isolation region, the sacrificial insulator in the recess is removed, and a floating gate region is defined. Then, the surfaces of the first polysilicon layer and polysilicon spacer in the floating gate region are oxidized to form a polysilicon oxide layer. Finally, the polysilicon oxide layer is used as a mask to pattern the underlying first polysilicon layer and polysilicon spacer in a self-aligned manner to form a floating gate. During the oxidation process, the polysilicon spacer of the present invention serves as a buffer layer, which is oxidized and protects the floating gate from being oxidized. Thus, the floating gate and STI overlay, and current leakage caused by insufficient overlay is prevented.

10 Claims, 14 Drawing Sheets

I-I'

A-A'

B-B'

A-A'

B-B'

A-A'

B-B'

A-A'

B-B'

A-A'

B-B'

PROCESS FOR FABRICATING A FLOATING GATE OF A FLASH MEMORY IN A SELF-ALIGNED MANNER

BACKGROUND OF THE INVENTION

1. Field of the Invention

The present invention relates to a process for fabricating a floating gate of a flash memory in a self-aligned manner, and more particularly to a process for fabricating a floating gate of a flash memory in a self-aligned manner using a polysilicon spacer as a buffer layer. Thus, current leakage caused by insufficient overlay between floating gate and STI can be prevented.

2. Description of the Prior Art

Flash memory is a type of erasable programmable read-only memory (EPROM), which in turn is a type of non-volatile memory. In general, flash memory includes two gates. One of the gates, known as a floating gate, is used for charge storage. The second gate, known as a control gate, is used for controlling the input and output of data. The floating gate is located beneath the control gate, and is generally in a floating state because there is no connection with external circuits. The control gate is normally wired to the word line. One of the advantages of flash memory is its capacity for block-by-block memory erasure. Furthermore, the speed of memory erasure is fast, and normally takes just 1 to 2 seconds for the complete removal of a whole block of memory. Therefore, in recent years, flash memory has been widely utilized in electrical consumer products, such as digital cameras, digital video cameras, cellular phones, laptop computers, mobile cassette players, and personal digital assistants (PDA).

The conventional process for fabricating flash memory usually uses photomasks to define the devices. Since the precision of the photomasks is limited, misalignment usually occurs for devices with a smaller line width. This causes open circuits or short circuits, and the electrical properties of the flash memory fail. Therefore, the device size of the conventional flash memory is limited by the design rule, so it is difficult to shrink the device size.

SUMMARY OF THE INVENTION

An object of the present invention is to solve the above-mentioned problems and provide a process for fabricating a floating gate of a flash memory in a self-aligned manner, which decreases tolerance and shrinks the device size.

Another object of the present invention is to provide a process for fabricating a floating gate of a flash memory to prevent current leakage caused by insufficient overlay between floating gate and STI.

To achieve the above objects, the process for fabricating a floating gate of a flash memory includes forming an isolation region in a semiconductor substrate, having a height higher than the semiconductor substrate; forming a gate oxide layer on the semiconductor substrate; forming a first polysilicon layer on the semiconductor substrate according to the contour of the isolation region to form a recess in the first polysilicon layer; filling a sacrificial insulator into the recess; selectively removing the first polysilicon layer in a self-aligned manner using the sacrificial insulator as a hard mask to expose the isolation region; forming a polysilicon spacer on the sidewalls of the first polysilicon layer; forming a first mask layer on the isolation region; removing the sacrificial insulator in the recess; defining a floating gate region; oxidizing the surfaces of the first polysilicon layer and polysilicon spacer in the floating gate region to form a polysilicon oxide layer; and using the polysilicon oxide layer as a mask to pattern the underlying first polysilicon layer and polysilicon spacer in a self-aligned manner to form a floating gate.

The present invention uses two self-alignment processes to form a floating gate. The first process involves using the height difference between the isolation region and the substrate to form a sacrificial insulator in a first polysilicon layer. Then, the first polysilicon layer is selectively removed using the sacrificial insulator as a hard mask in a self-aligned manner to expose the isolation region. The second process involves oxidizing the surfaces of the first polysilicon layer and polysilicon spacer in a floating gate region to form a polysilicon oxide layer. Then, the first polysilicon layer and polysilicon spacer are patterned using the polysilicon oxide layer as a mask in a self-aligned manner to form a floating gate. Since the floating gate is formed in a self-aligned manner, the device size can be shrunk.

Moreover, during the oxidation process to form a polysilicon oxide layer, the polysilicon spacer of the present invention serves as a buffer layer, which is oxidized and protects the floating gate from being oxidized. Thus, the floating gate and STI overlay, and current leakage caused by insufficient overlay can be prevented.

BRIEF DESCRIPTION OF THE DRAWINGS

The present invention will become more fully understood from the detailed description given hereinbelow and the accompanying drawings, given by way of illustration only and thus not intended to be limitative of the present invention.

DETAILED DESCRIPTION OF THE PREFERRED EMBODIMENTS

Figure 1:
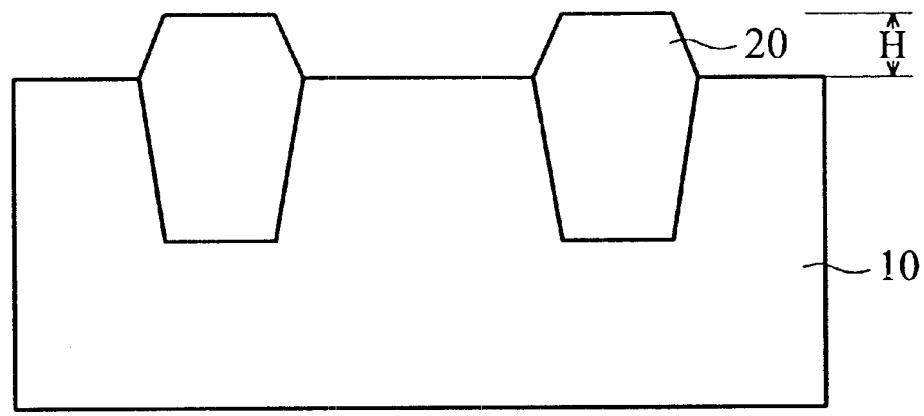
FIGS. 1 to 10 are cross-sections taken along line I–I' of the semiconductor substrate of FIG. 1A, showing the process flow of fabricating a floating gate of a flash memory according to the present invention.

Referring to FIG. 1, an isolation region 20 is formed in a semiconductor substrate 10 such that the isolation region 20 is higher than the semiconductor substrate 10 by a height H. The isolation region can be a shallow trench isolation (STI) as shown in FIG. 1, which can be formed by a well-known process. For example, first, a pad oxide layer (not shown) is formed on the substrate 10. The pad oxide layer can be a silicon oxide layer formed by a chemical vapor deposition (CVD) process, or grown thermally. Next, a nitride layer (not shown) is formed on the pad oxide layer. The nitride layer can be formed by reacting dichlorosilane ($SiCl_2H_2$) with ammonia ($NH_3$) through a LPCVD process. The nitride layer and pad oxide layer are then either dry or wet etched by photolithography. The etching is further carried into the substrate to form a shallow trench. Subsequently, the trench is filled with insulator, thus forming the STI region 20. Finally, the nitride layer and pad oxide layer are removed, thus the STI region 20 protrudes above the substrate 10 and higher than the substrate 10 by a height H. The height H is preferably 150 Å to 450 Å.

Figure 2:
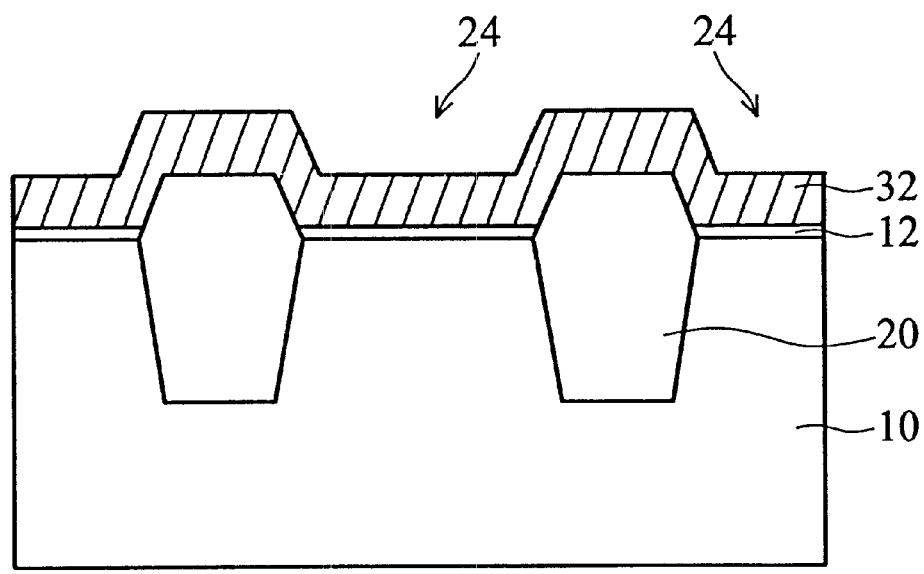

Subsequently, referring to FIG. 2, a gate oxide layer 12 is formed on the semiconductor substrate 10. The gate oxide layer 12 can be formed by thermal oxidation at 750° C. to 950° C. to a thickness of 70 Å to 100 Å. Next, a first polysilicon layer 32 is formed on the substrate according to the contour of the isolation region 20, such that a recess 24 is formed in the first polysilicon layer 32. The first polysilicon layer 32 can be formed by a chemical vapor deposition process, for example, LPCVD employing silane ($SiH_4$) as a silicon source material at a temperature range between 350° C. to 650° C. The polysilicon is preferably doped with phosphorus. For example, the polysilicon can be implanted with phosphorus at a dosage level between about $1\times10^{14}$ to $2\times10^{14}$ atoms/$cm^2$ at an energy level between about 20 to 30 keV.

Figure 3:
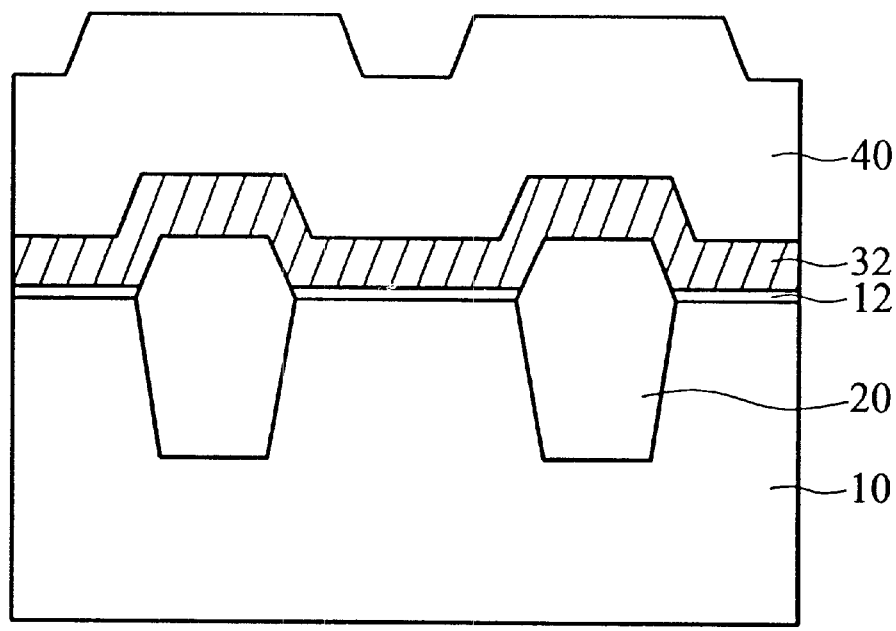
Figure 4:
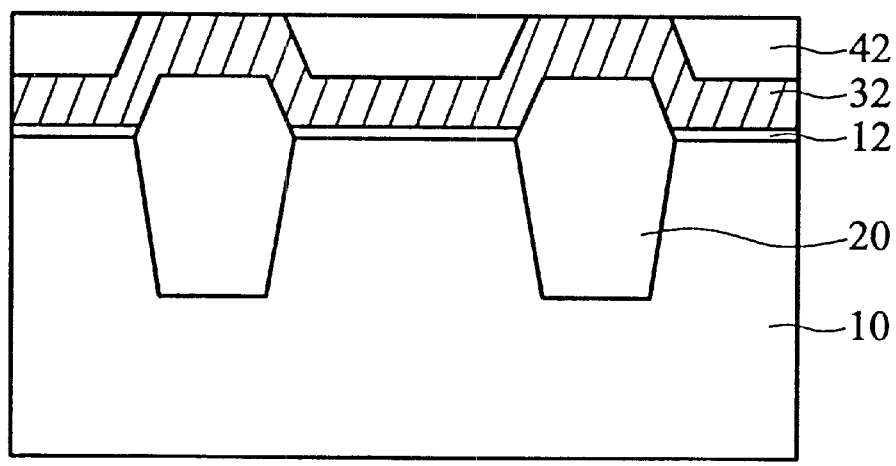

Subsequently, a sacrificial insulator is filled in the recess 24. For example, referring to FIG. 3, a sacrificial insulating layer 40 is formed on the first polysilicon layer 32, such that the sacrificial insulating layer is filled in the recess 24. The sacrificial insulating layer 40 can be silicon oxide and can be formed by an atmospheric or low pressure chemical vapor deposition (LPCVD) process to a thickness of 1500 Å to 2500 Å. Next, referring to FIG. 4, a chemical mechanical polishing (CMP) process is subjected to the sacrificial insulating layer 40 using the first polysilicon layer 32 as a polishing stop layer. Thus, a sacrificial insulator 42 is formed.

Figure 5:
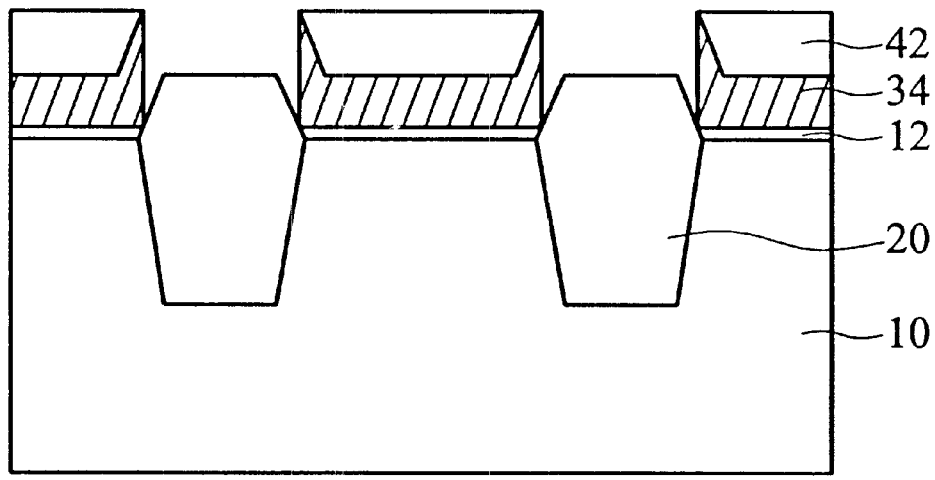

Subsequently, referring to FIG. 5, the polysilicon layer 32 is selectively removed in a self-aligned manner using the sacrificial insulator 42 as a hard mask. Thus, the isolation region 20 is exposed. The first polysilicon layer after removal is labeled with 34.

Figure 6:
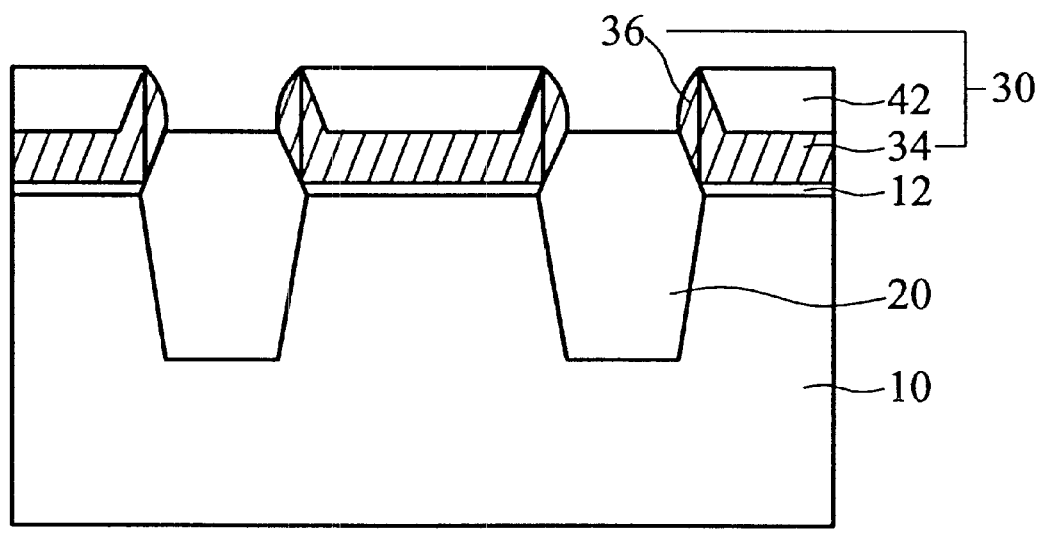

Subsequently, referring to FIG. 6, a polysilicon spacer 36 is formed on the sidewalls of the first polysilicon layer 34. For example, a second polysilicon layer (not shown) is deposited on the substrate by, for example, a LPCVD process employing silane ($SiH_4$) as a silicon source material at a temperature range between 350° C. to 650° C. Similarly, the second polysilicon layer can be doped with phosphorus. For example, the second polysilicon layer can be implanted with phosphorus at a dosage level between about $1\times10^{14}$ to $2\times10^{14}$ atoms/$cm^2$ at an energy level between about 20 to 30 keV. Then, the second polysilicon layer is etched back with anisotropic etching using the sacrificial insulator 42 as a hard mask. Thus, the polysilicon spacer 36 is formed. The first polysilicon layer 34 and the polysilicon spacer 36 are combined and referred to by the numeral 30 (a combined polysilicon layer).

Figure 7:
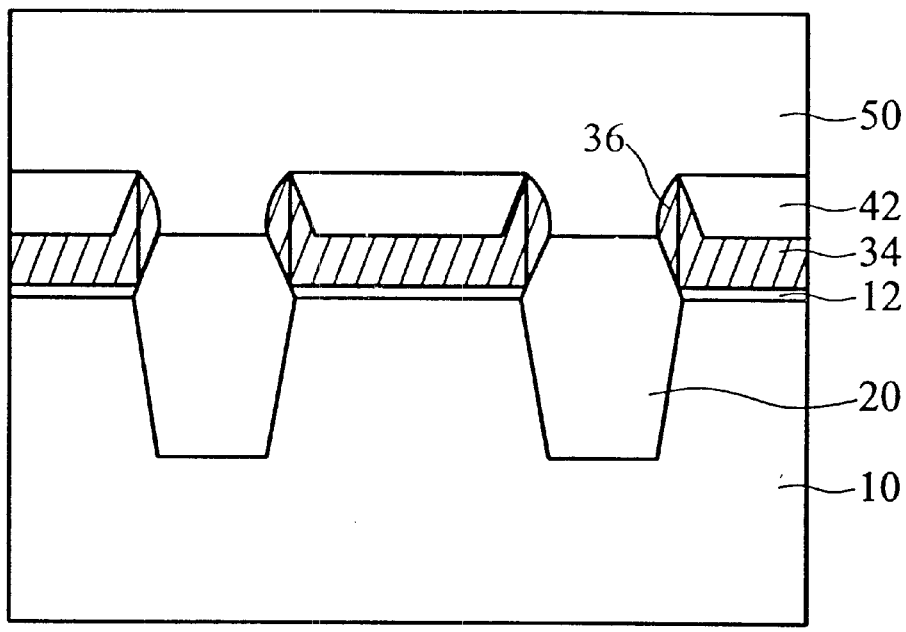
Figure 8:
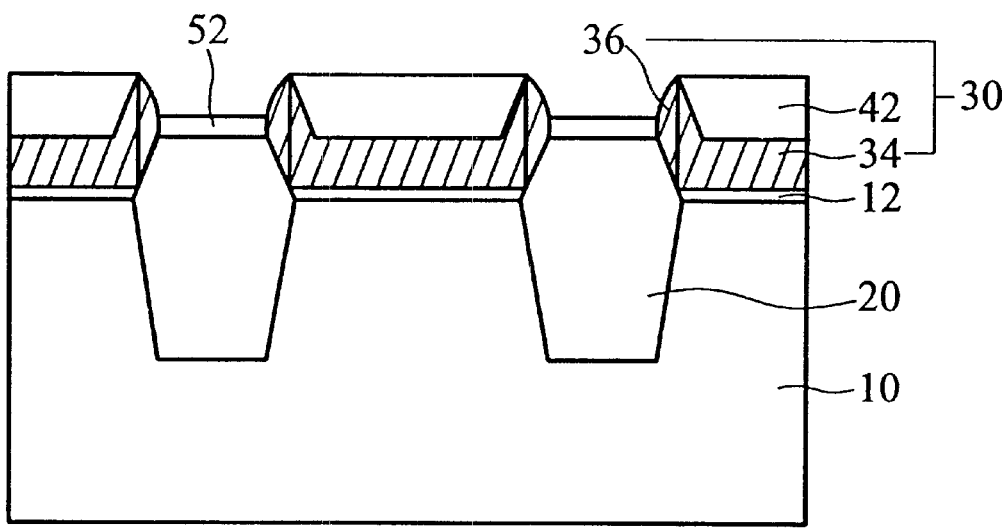

Subsequently, a first mask layer is formed on the isolation region 20. The first mask layer can be silicon nitride. For example, referring to FIG. 7, a silicon nitride layer 50 is blanket deposited on the sacrificial insulator 42, the polysilicon spacer 36, and the isolation region 20. Next, referring to FIG. 8, the silicon nitride layer 50 is dry etched to leave a residual silicon nitride layer 52 on the isolation region 20. This residual silicon nitride layer 52 can protect the isolation region 20 from etching when the sacrificial insulator 42 is removed at the next step.

Figure 1A:
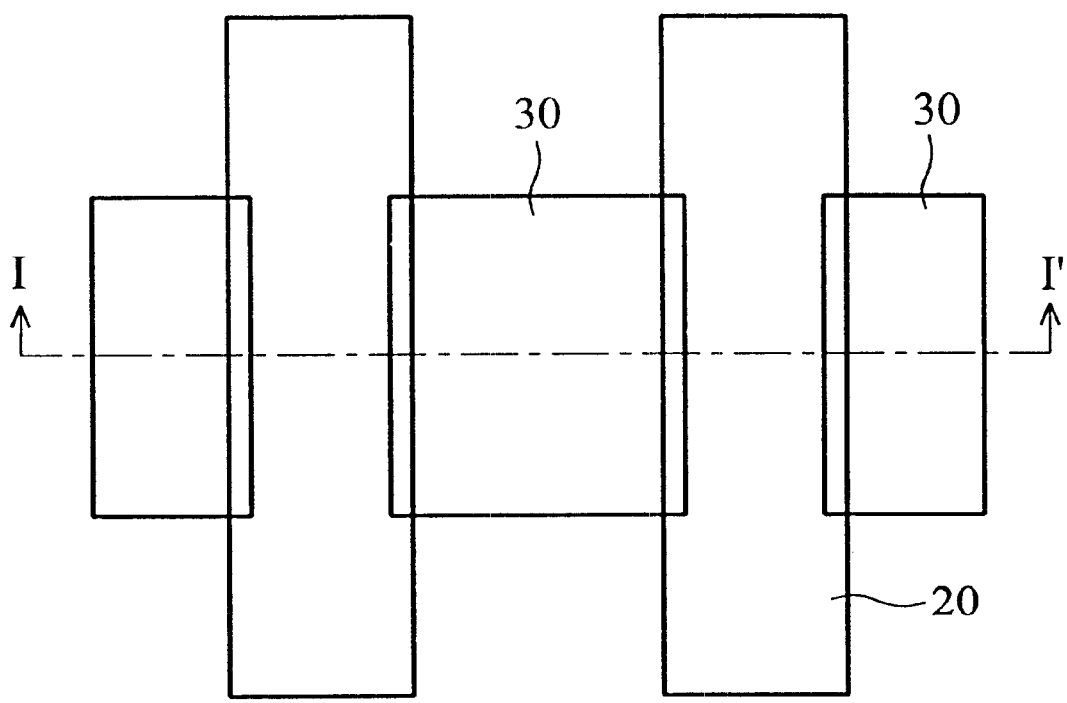
FIG. 1A is a top view of the semiconductor substrate after a first self-alignment is conducted according to the process for fabricating a floating gate of a flash memory of the present invention.
Figure 9:
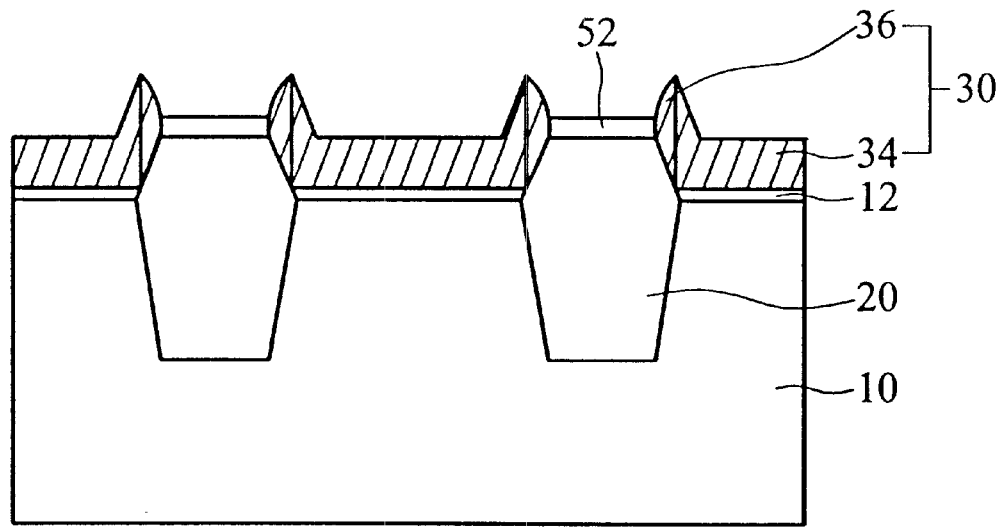

Subsequently, referring to FIG. 9, the sacrificial insulator 42 in the recess 24 is removed. The removal of the sacrificial insulator 42 can use wet etching conducted by a hydrofluoric acid solution. Refer to FIG. 1A, showing the top view layout of the substrate of FIG. 9. FIG. 9 is a cross-section taken along line I–I'.

Figure 10:
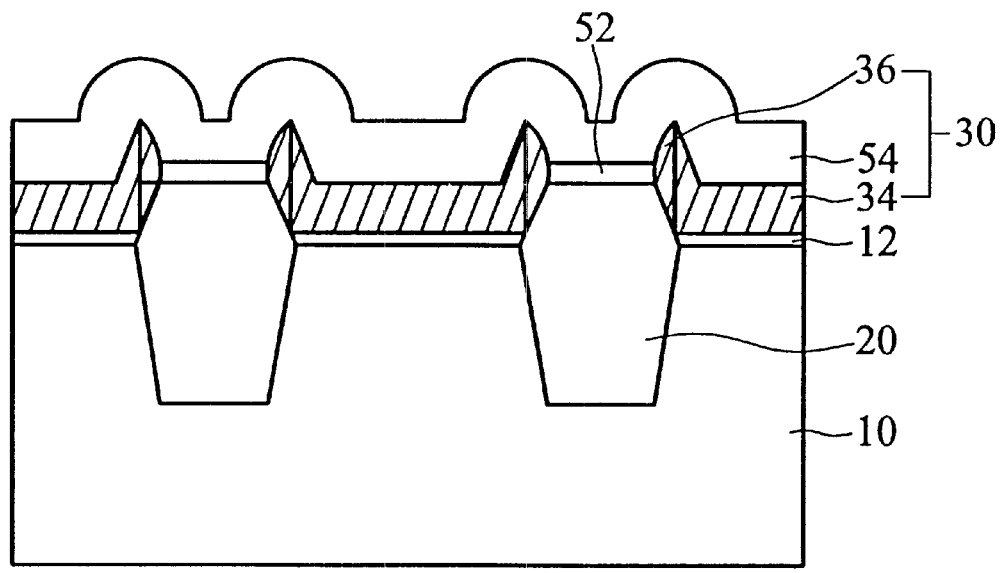
Figure 11A:
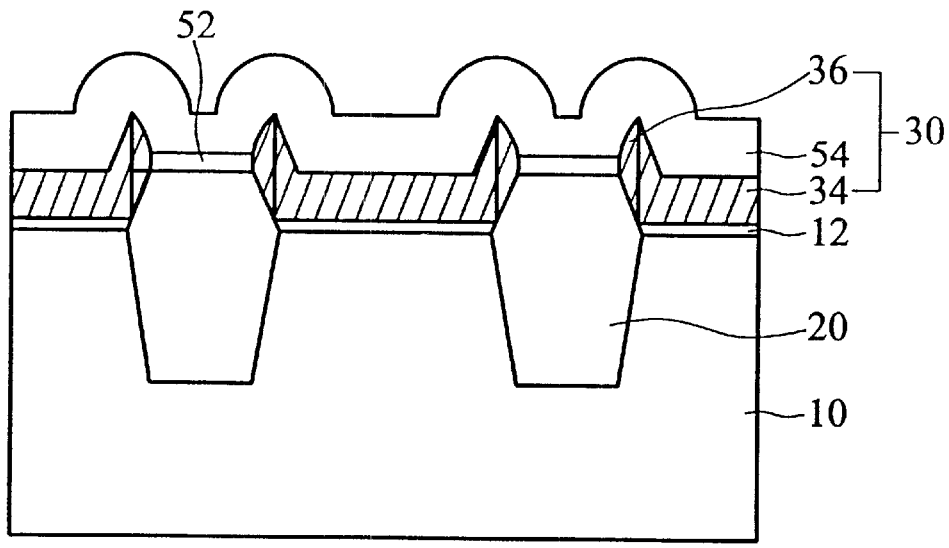
FIGS. 11 to 15 show the process flow of conducting a second self-alignment according to the process of the present invention. The figures labeled with C are top view layouts, the figures labeled with A are cross-sections taken along line A–A', and the figures labeled with B are cross-sections taken along line B–B'.
Figure 11B:
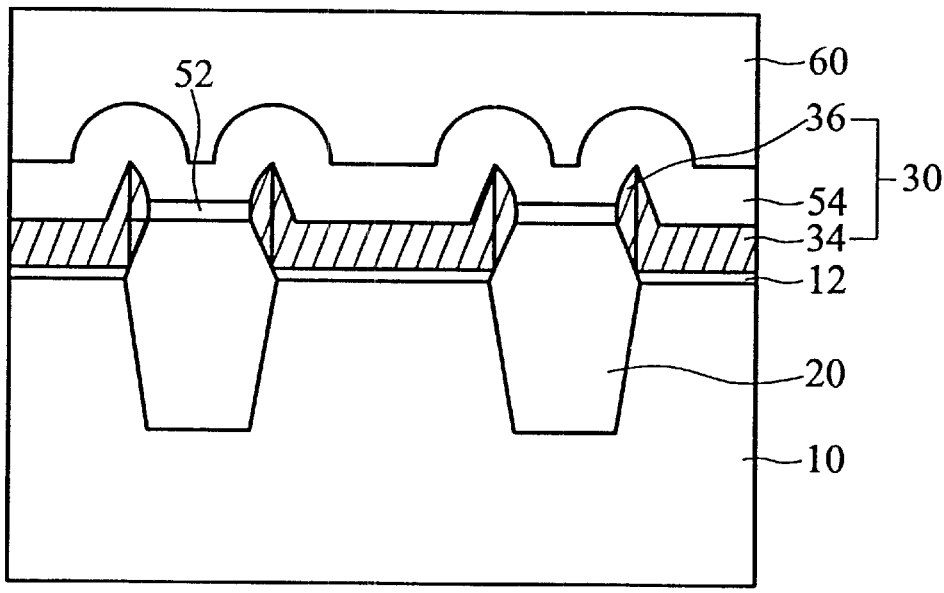
Figure 11C:
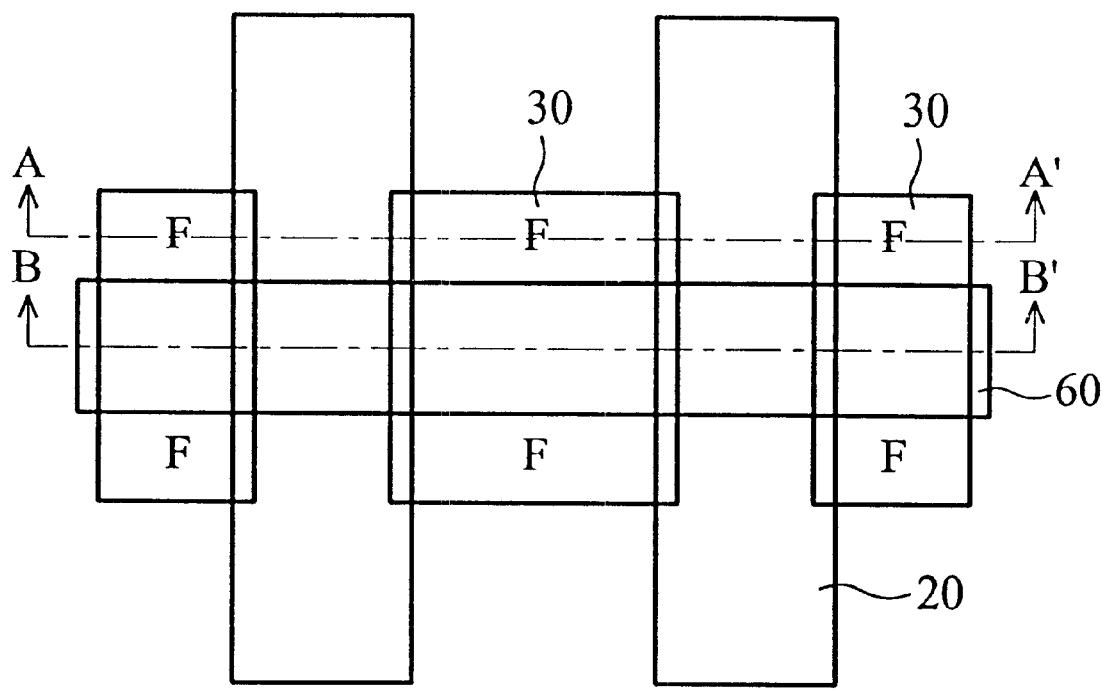
Figure 12A:
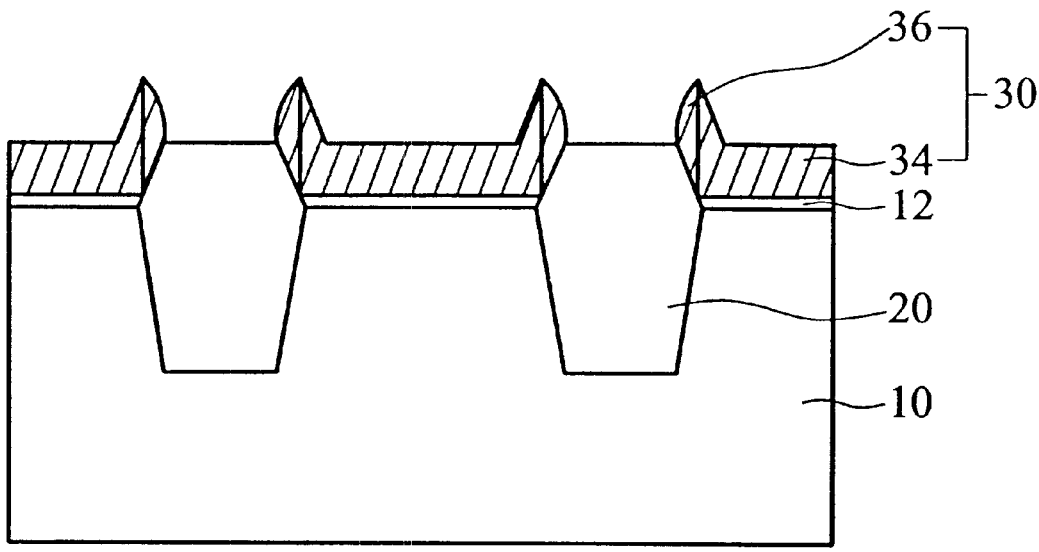
Figure 12B:
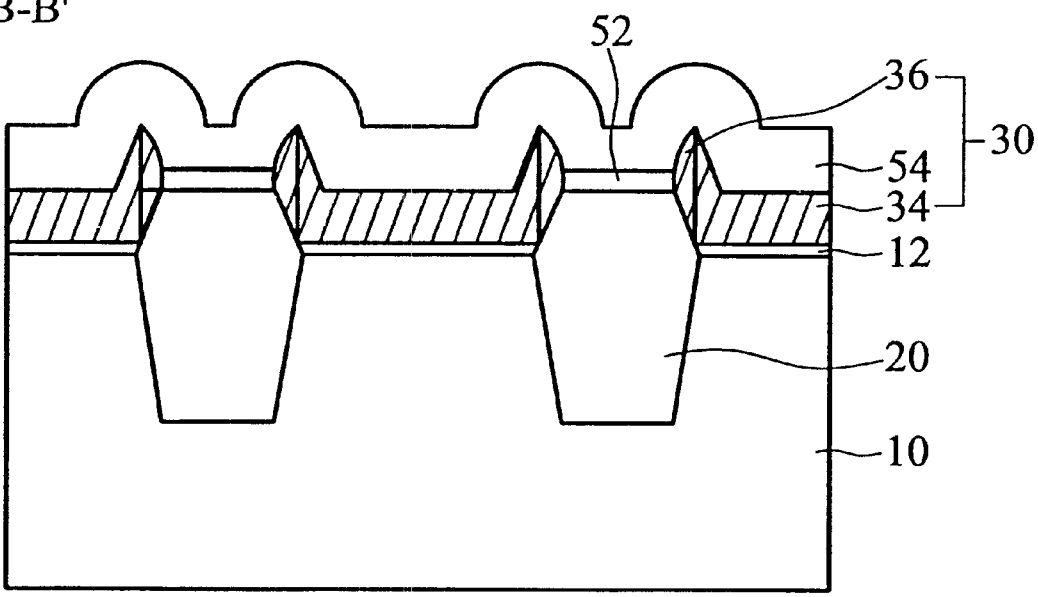

Subsequently, a floating gate region is defined. For example, referring to FIG. 10, a second mask layer 54, for example, a silicon nitride layer, is conformally formed over the whole surface of the substrate. Then, referring to FIGS. 11A to 11C, a patterned photoresist layer 60 is formed on the mask layer 54. The region uncovered by the photoresist layer 60 is that for forming a floating gate in the future, which is called a floating gate region F. Next, referring to FIGS. 12A and 12B, the mask layer 54 uncovered by the photoresist layer 60 is removed, thus exposing the combined polysilicon layer 30. Then, the photoresist layer 60 is removed.

Figure 13A:
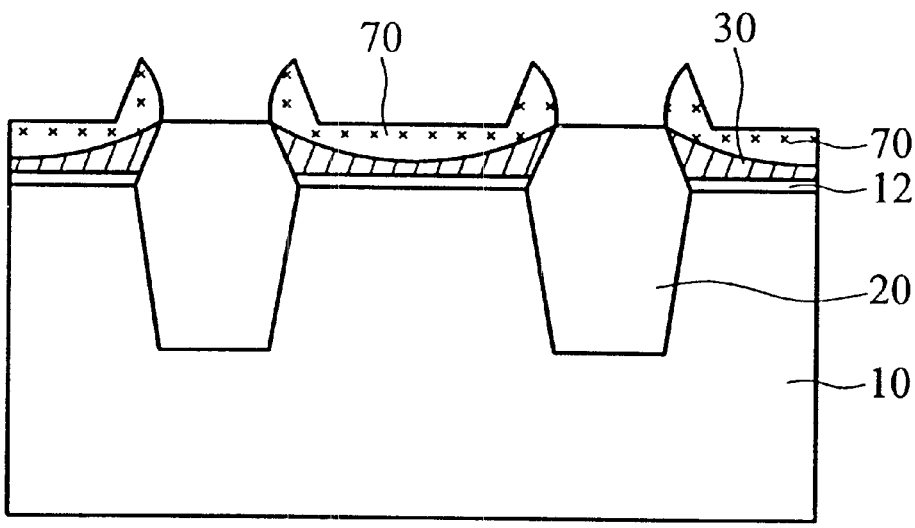
Figure 13B:
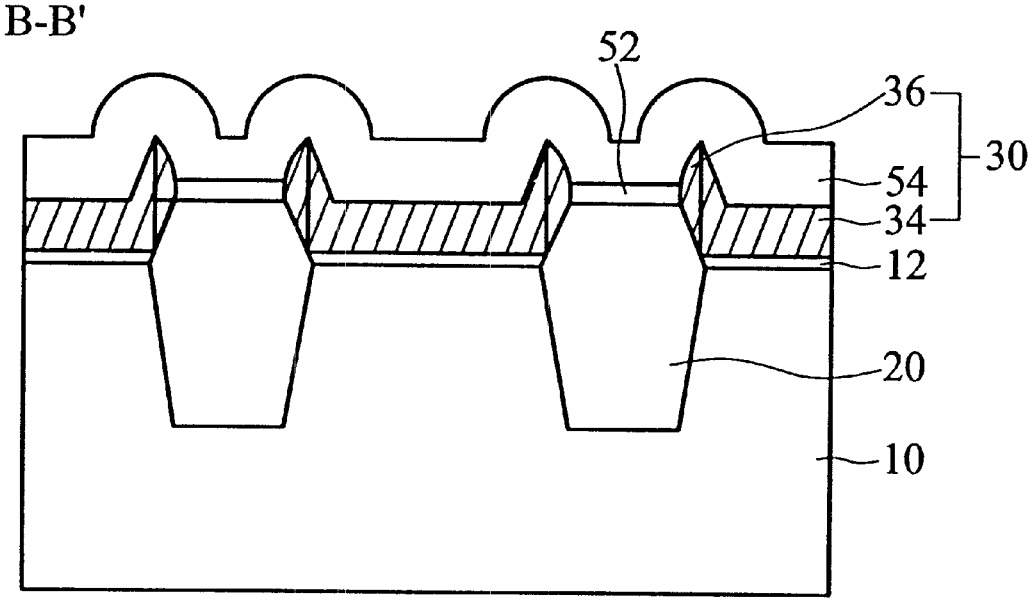
Figure 14A:
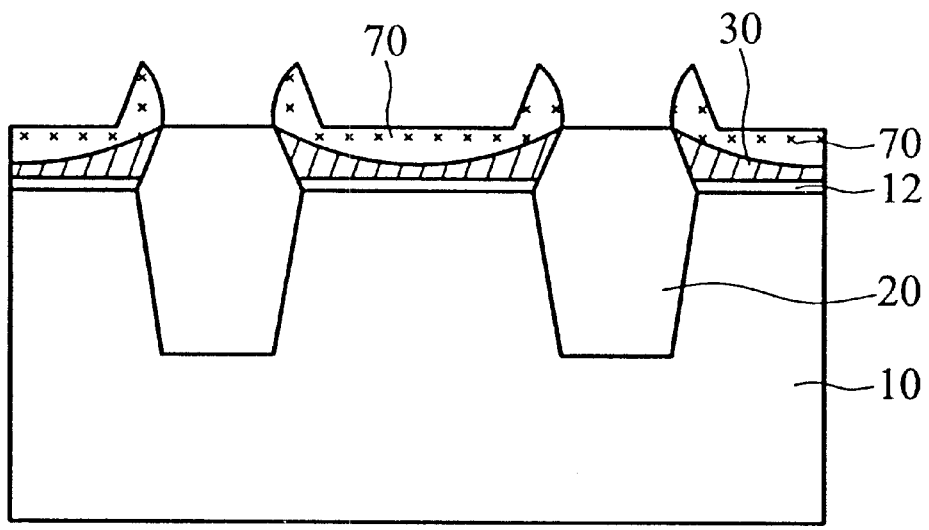
Figure 14B:
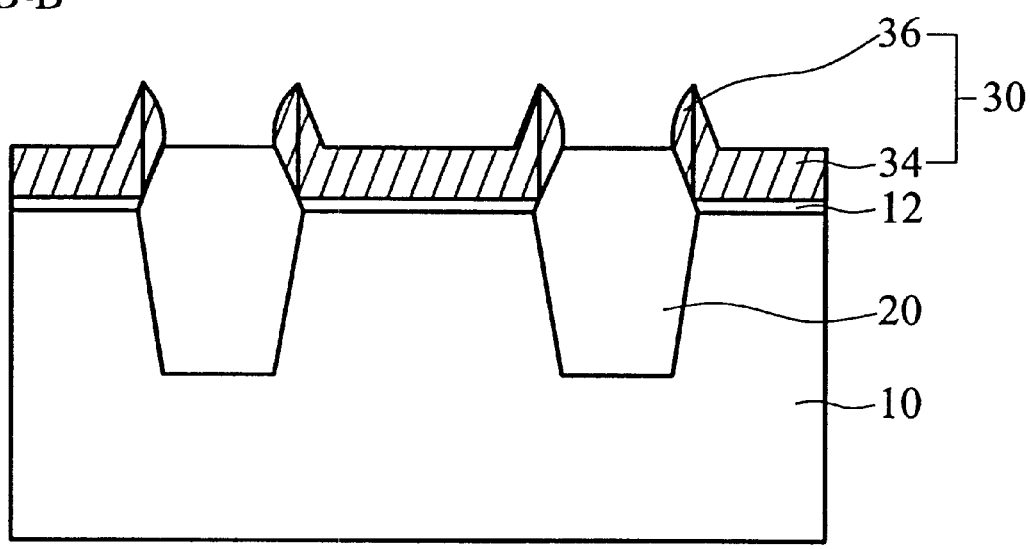

Subsequently, the surfaces of the first polysilicon layer and polysilicon spacer in the floating gate region F are oxidized to form a polysilicon oxide layer (polyoxide layer). For example, referring to FIGS. 13A and 13B, the exposed combined polysilicon layer 30 (including the first polysilicon layer 34 and polysilicon spacer 36) is subjected to thermal oxidation at 800° C. to 1000° C. Thus, the surface of the combined polysilicon layer 30 turns into a polyoxide layer 70. The thickness of the polyoxide layer 70 is preferably 1000 Å to 2000 Å. Then, the second mask layer 54 is removed, as shown in FIGS. 14A and 14B.

Figure 15A:
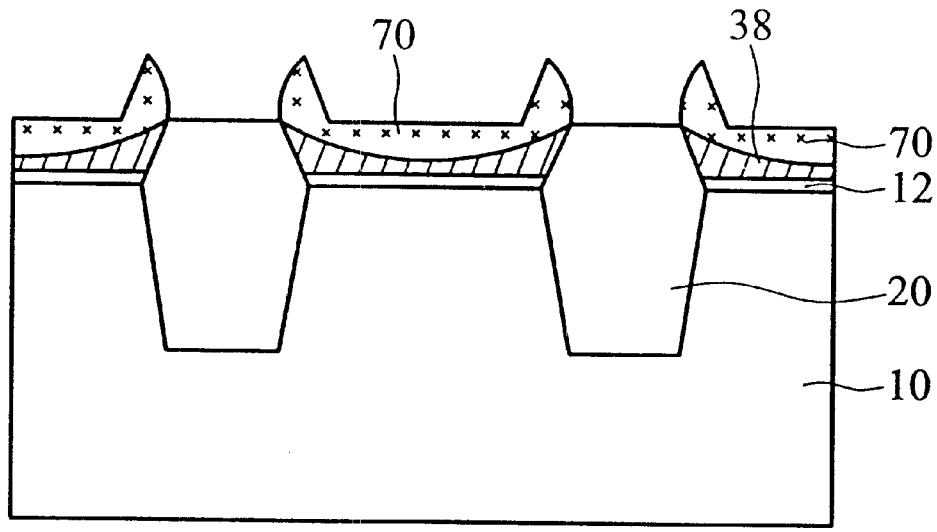
Figure 15B:
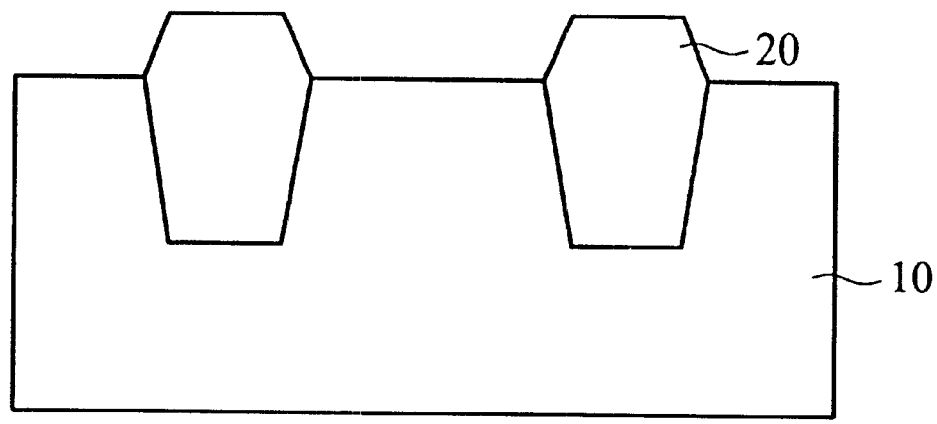
Figure 15C:
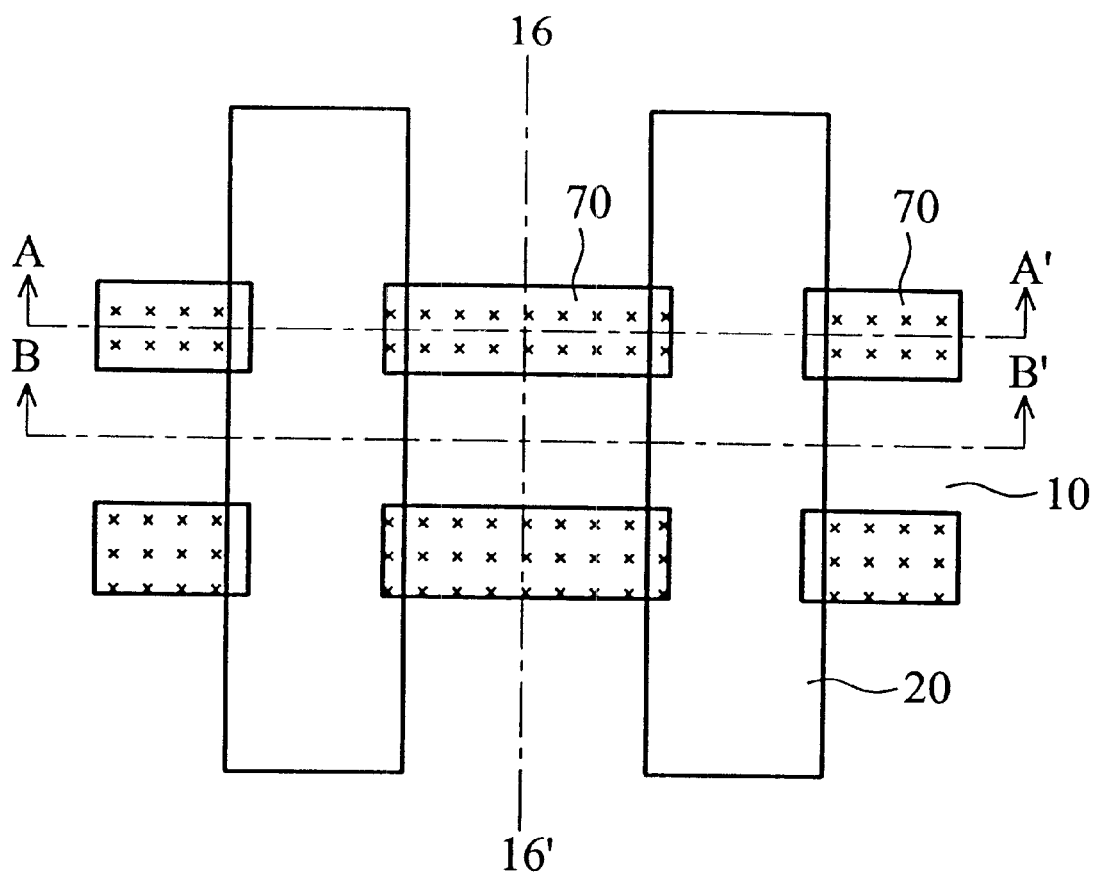
Figure 16:
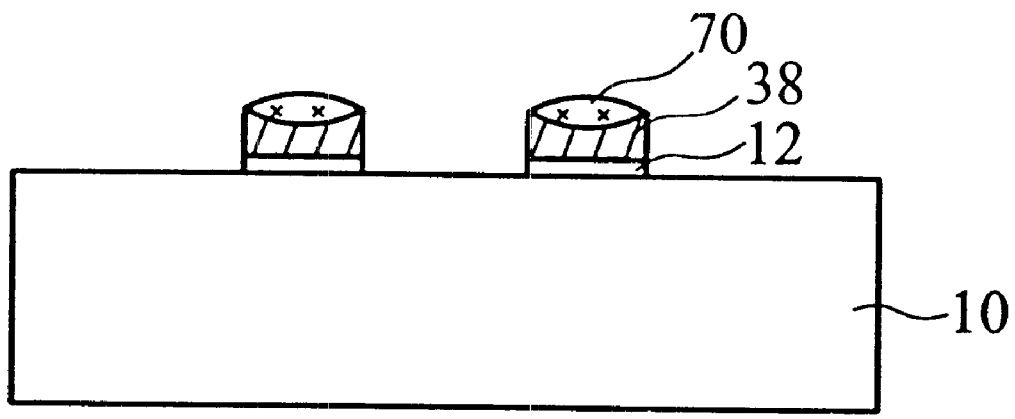
FIG. 16 is a cross-section taken along line 16–16' of FIG. 15C.

Subsequently, referring to FIGS. 15A to 15C, the combined polysilicon layer 30 (including the first polysilicon layer 34 and the polysilicon spacer 36) is patterned in a self-aligned manner using the polyoxide layer 70 as a hard mask. Thus, a floating gate 38 is formed as show in FIG. 16.

The main feature of the present invention is the formation of a polysilicon spacer 36. Generally speaking, in order to form a polysilicon oxide layer to serve as a hard mask for etching an underlying polysilicon layer and to generate a polysilicon tip, an oxidation process must be conducted. In the absence of the polysilicon spacer 36 of the present invention, when the oxidation process is conducted, the edges of the floating gate are oxidized. This results in insufficient overlay between the floating gate and STI, which in turn causes current leakage. During the oxidation process, the polysilicon spacer 36 of the present invention serves as a buffer layer, which is oxidized and protects the floating gate from being oxidized. Thus, the floating gate and STI overlay, and current leakage caused by insufficient overlay can be prevented.

Moreover, the present invention uses two self-alignment processes to form a floating gate. The first process involves using the height difference between the isolation region 20 and the substrate 10 to form a sacrificial insulator 42 in a first polysilicon layer 32. Then, the first polysilicon layer 32 is selectively removed using the sacrificial insulator 42 as a hard mask in a self-aligned manner to expose the isolation region. The second process involves oxidizing the surfaces of the first polysilicon layer 34 and polysilicon spacer 36 in a floating gate region to form a polysilicon oxide layer 70. Then, the first polysilicon layer 34 and polysilicon spacer 36 are patterned using the polysilicon oxide layer 70 as a mask in a self-aligned manner to form a floating gate. Since the floating gate is formed in a self-aligned manner, the device size can be shrunk.

The foregoing description of the preferred embodiments of this invention has been presented for purposes of illustration and description. Obvious modifications or variations are possible in light of the above teaching. The embodiments chosen and described provide an excellent illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A process for fabricating a floating gate of a flash memory, comprising the following steps:

forming an isolation region in a semiconductor substrate, having a height higher than the semiconductor substrate;

forming a gate oxide layer on the semiconductor substrate;

forming a first polysilicon layer on the semiconductor substrate according to the contour of the isolation region to form a recess in the first polysilicon layer;

filling a sacrificial insulator into the recess;

selectively removing the first polysilicon layer in a self-aligned manner using the sacrificial insulator as a hard mask to expose the isolation region;

forming a polysilicon spacer on the sidewalls of the first polysilicon layer;

forming a first mask layer on the isolation region;

removing the sacrificial insulator in the recess;

defining a floating gate region;

oxidizing the surfaces of the first polysilicon layer and polysilicon spacer in the floating gate region to form a polysilicon oxide layer; and using the polysilicon oxide layer as a mask to pattern the underlying first polysilicon layer and polysilicon spacer in a self-aligned manner to form a floating gate.

2. The process as claimed in claim 1, wherein the isolation region is a shallow trench isolation (STI).

3. The process as claimed in claim 2, wherein the isolation region is higher than the semiconductor substrate by 150 Å to 450 Å.

4. The process as claimed in claim 1, wherein the sacrificial insulator is silicon dioxide.

5. The process as claimed in claim 1, wherein the step of filling a sacrificial insulator into the recess comprises:

forming a sacrificial insulating layer on the first polysilicon layer; and subjecting the sacrificial insulating layer to chemical mechanical polishing (CMP) using the first polysilicon layer as a polishing stop layer.

6. The process as claimed in claim 1, wherein the step of forming a polysilicon spacer on the sidewalls of the first polysilicon layer comprises:

forming a second polysilicon layer on the semiconductor substrate; and etching back the second polysilicon layer using the sacrificial insulator as a mask.

7. The process as claimed in claim 1, wherein the mask layer is formed of silicon nitride.

8. The process as claimed in claim 1, wherein the step of forming a polysilicon oxide layer is conducted by thermal oxidation.

9. The process as claimed in claim 8, wherein the polysilicon oxide layer has a thickness of 1000 Å to 2000 Å.

10. The process as claimed in claim 1, wherein the step of defining a floating gate region comprises:

forming a second mask layer over the entire surface of the semiconductor substrate;

forming a patterned photoresist layer on the second mask layer such that an area uncovered by the patterned photoresist layer defines the floating gate region; and removing the second mask layer and photoresist layer.

* * * * *